United States Patent [19]

Conway et al.

[11] Patent Number: 4,562,429
[45] Date of Patent: Dec. 31, 1985

[54] STATIC EVENT DETECTOR AND TAPE PROBE

[75] Inventors: John T. Conway, Lockport; Robert C. Albone, Middleport, both of N.Y.

[73] Assignee: Monroe Electronics, Inc., Lyndonville, N.Y.

[21] Appl. No.: 372,127

[22] Filed: Apr. 27, 1982

[51] Int. Cl.[4] .............................................. G08B 21/00
[52] U.S. Cl. ..................................... 340/657; 324/457
[58] Field of Search ............... 340/657; 324/457, 72.5; 174/70 C, 72 TR, 117 FF

[56] References Cited

U.S. PATENT DOCUMENTS

| | | | |
|---|---|---|---|
| 3,404,341 | 10/1968 | Young | 324/109 |
| 3,452,346 | 6/1969 | Kupersmit | 340/248 |
| 3,482,235 | 12/1969 | Johnson | 340/657 |
| 3,522,531 | 8/1970 | Cohn | 324/72 |
| 3,667,036 | 5/1972 | Seachman | 324/72 |
| 3,729,675 | 4/1973 | Vosteen | 324/457 |
| 3,760,794 | 9/1973 | Basham | 340/657 X |
| 3,774,110 | 11/1973 | Roveti | 324/133 |
| 3,857,066 | 12/1974 | Cline et al. | 317/2 R |
| 4,053,875 | 10/1977 | Kupersmit | 340/248 |
| 4,127,806 | 11/1978 | Shuey et al. | 324/32 |
| 4,139,813 | 2/1979 | Shaffer | 324/32 |
| 4,197,493 | 4/1980 | Juve et al. | 324/72 |
| 4,297,522 | 10/1981 | Jesse et al. | 174/117 FF |
| 4,318,042 | 3/1982 | Eda et al. | 324/457 |
| 4,330,749 | 3/1982 | Eda et al. | 324/457 |

FOREIGN PATENT DOCUMENTS

| | | | |
|---|---|---|---|
| 929229 | 6/1973 | Canada | 324/47 |
| 1012607 | 6/1977 | Canada | 324/47 |
| 2332128 | 1/1975 | Fed. Rep. of Germany | |
| 691786 | 10/1979 | U.S.S.R. | |

OTHER PUBLICATIONS

Rosenthal et al., "Static Electricity Events Detector," 45 Rev. Sci. Instrum., 10, pp. 1239–1241 (Oct. 1974).

Primary Examiner—Jerry W. Myracle
Attorney, Agent, or Firm—Finnegan, Henderson, Farabow, Garrett & Dunner

[57] ABSTRACT

A multilayer tape probe for measuring the movement of charge has at least a pickup electrode comprising one layer of electrically conductive tape and a shield electrode comprising another layer of electrically conductive tape, the pickup and shield electrodes being separated by a dielectric strip. Circuitry is connected to the probe to drive the shield electrode and to monitor the potential difference between ground and pickup electrodes and actuate an alarm if an unwanted charge is present.

18 Claims, 5 Drawing Figures

STATIC EVENT DETECTOR AND TAPE PROBE

BACKGROUND OF THE INVENTION

The present invention relates to the field of static electricity detectors and, in particular, to detectors which sense the presence of charged objects in a large area.

In certain manufacturing concerns, static electricity is a very major problem. A small amount of static charge can destroy certain semiconductor devices and wreak havoc during photographic processing. Static electricity is often carried on workers' clothing into a work area and transferred into a work area. In fact, anyone in or near a work area can inadvertently damage an electricity-sensitive process with static charge.

Because the effects of static charges are usually not immediately known, a semiconductor device destroyed by static charge may not be detected until it is later tested or used. By the same token, even when an inoperable device is found, the cause of the failure cannot always be determined. This uncertainty makes it difficult to improve manufacturing and processing techniques.

Workers in industries where static electricity is a problem are usually "grounded" through wires running from a point at ground potential to conductive bracelets on the workers' wrists. This type of protection is limited because a broken or loose ground wire destroys the ground path. Grounding bracelets also do not prevent damage caused by non-workers who enter a charge-sensitive work area without taking proper grounding procedures.

Electric field meters are also used in industries where static electricity is a problem. These meters are directed at a work area to register the amount of charge moving into and out of that area. Unfortunately, the range of such meters is limited, so many are usually required to cover a work area. Furthermore, the meters give no indication of how great a charge has been transferred into the area nor how far away the charge was from the meters. An electric field meter will register the same intensity for a small charge close to the meter and for a larger charge farther away from the meter.

It is, therefore, an object of the present invention to detect the movement of harmful electric charges into a work area.

It is also an object of the present invention to detect the movement of such charges into a work area with a single device, even though the work area is large.

It is a further object of the present invention to detect the movement of charge into an area such that it can later be determined which devices and processes have been affected.

Additional objects and advantages of the present invention will be set forth in part in the description which follows and in part will be obvious from that description or may be learned by practice of the invention. The objects and advantages of invention may be realized and obtained by the methods and apparatus particularly pointed out in the appended claims.

SUMMARY OF THE INVENTION

The present invention overcomes the problems of the prior art and achieves the objects listed above by sensing charge movement with a multi-layer tape probe, one of the layers being a pickup electrode and another layer being a driven shield electrode, and actuating an alarm device if the potential between the pickup electrode and ground exceeds a predetermined level.

To achieve the objects in accordance with the purpose of the invention, as embodied and as broadly described herein, the probe of this invention for sensing the presence of charged objects comprises a first layer of flat conductive tape acting as a pickup electrode, a second layer of flat conductive tape acting as a shield electrode and having one of its two flat sides aligned with one of the flat sides of the first layer of flat conductive tape, and a first strip of dielectric material aligned with and positioned between the first and second layers of conductive tape.

The apparatus for detecting the movement of a charged object into an area comprises: a probe which includes a first layer of flat conductive tape acting as a pickup electrode, a second layer of flat conductive tape acting as a shield electrode and having one of its two flat sides aligned with one of the flat sides of the first layer of flat conductive tape, and a first strip of dielectric material aligned with and positioned between the first and second layers of conductive tape; and means connected to the probe for monitoring the potential on said first layer of conductive tape and for driving the second layer of tape with a signal proportional to said potential on said first layer.

The accompanying drawings, which are incorporated in and which constitute a part of this specification, illustrate one embodiment of the invention and, together with the description, explain the principles of the invention.

DESCRIPTION OF THE PREFERRED EMBODIMENT

Reference will now be made in detail to a presently preferred embodiment of the invention which is illustrated in the accompanying drawings.

The static event detector of this invention has two main elements: a multilayer tape probe to sense the presence of electric fields caused by static charges; and circuitry, connected to the tape probe, to amplify a sense signal generated by the tape probe and to compare that sense signal to a predetermined value. As described in detail below, the circuitry also drives one of the tape layers to improve the sensitivity of the static event detector.

Figure 1:
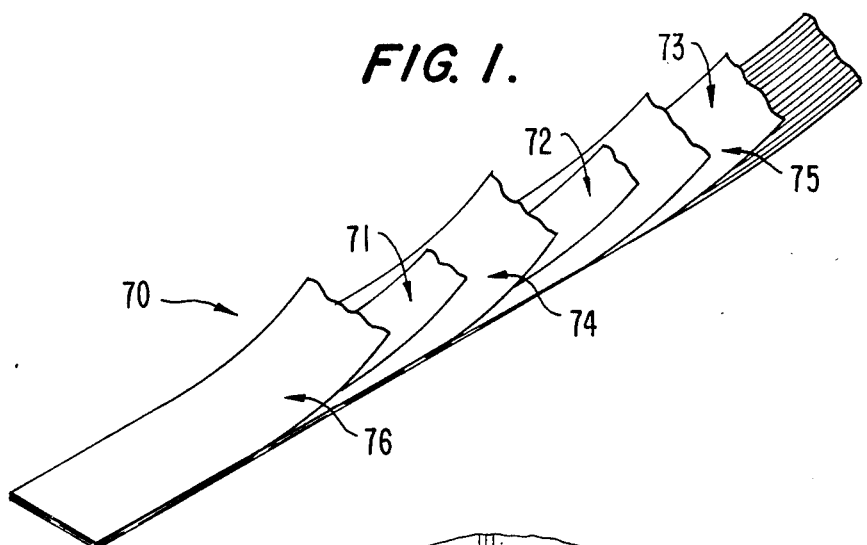
FIG. 1 is a perspective view of the probe of this invention with its layers separated.

The preferred embodiment of tape probe 70 of this invention is shown in FIG. 1. The layers of tape probe 70 are not normally separated in the manner shown in FIG. 1, but these layers should be separable to facilitate soldering. As shown in FIG. 1, tape probe 70 has three (3) layers of flat conductive, preferably metallic, tape: pickup electrode 71, shield electrode 72, and ground electrode 73. These layers of conductive tape are separated by dielectric strips 74 and 75 as shown in FIG. 1.

The probe is constructed by aligning the layers of conductive tape and the dielectric strips in the proper order on top of each other. Adhesive backing on the tape and on the strips bonds the layers together.

In the preferred embodiment, the electrodes are commercially-available copper foil tapes with a nonconductive adhesive backing. These copper foil tapes are are about 0.076 millimeters thick. Pickup electrode 71 and shield electrode 72 are preferably ⅜ inches wide while ground electrode 73 is preferably ½ inch wide.

Dielectric strips 74 and 75 are, in the preferred embodiment, made of a polyester film. Mylar has been found to be an effective material for the strips. The Mylar strips are 0.056 millimeters thick and ½ inch wide.

In the tape probe shown in FIG. 1, the pickup and shield electrodes are aligned by centering them with respect to dielectric strip 74. By so centering the electrodes, strip 74 electrically isolates the pickup and shield electrodes from each other (since dielectric strip 74 is wider than the electrodes), and the electrodes and the dielectric strip form a capacitor.

When a static charge is brought near tape probe 70, the potential between the pickup electrode and ground changes. This change in potential is sensed by the circuitry described below to indicate the presence of the charge.

The tape probe of this invention can operate with a ground electrode, shown in FIG. 1 as electrode 73, to provide additional shielding for the probe. Ground electrode 73 is electrically isolated from and aligned with shield electrode 72 by centering both electrodes with respect to dielectric strip 75.

It is also recommended that a third dielectric strip 76 be placed above the pickup electrode to protect that electrode from damage and from inadvertent contact with items in the work area. In the embodiment illustrated in FIG. 1, dielectric strip 76 is made of the same material and has the same dimensions as do dielectric strips 74 and 75.

Figure 2:
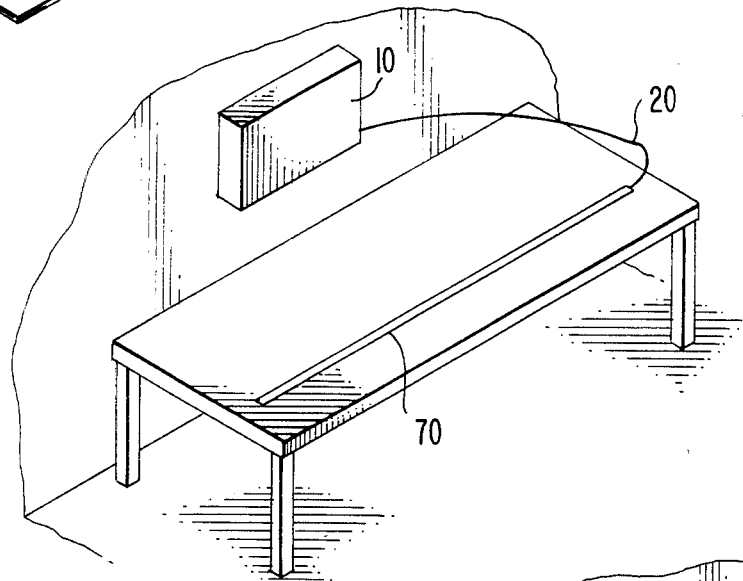
FIG. 2 is a perspective view of the static event detector of this invention with the probe of FIG. 1 placed along a work bench.

FIG. 2 shows the static event detector in use on a work bench. Tape probe 70 lays along the surface of a work bench at the edge of the bench nearest the worker and is attached to the bench to keep the probe stationary. If a worker at the work bench in FIG. 2 moves over tape probe 70 into the work area on the bench with a potentially harmful charge, the electric field from that charge is sensed by the static event detector. The tape probe can be extremely long for the reasons explained below and thus can protect an entire work area, even though that work area may be very large.

Figure 3:
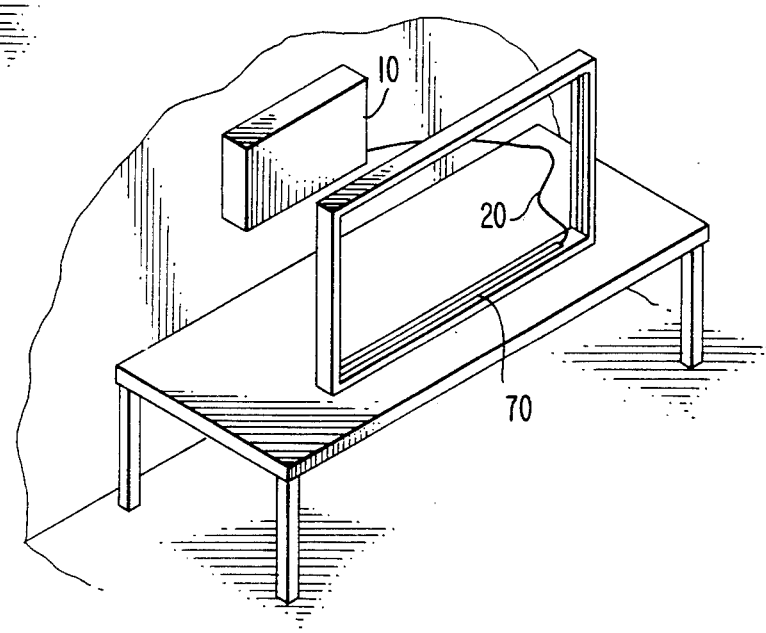
FIG. 3 is a perspective view of the static event detector of FIG. 2 with the tape probe of FIG. 1 placed in a rectangular loop configuration on a work bench.

The efficacy of the tape probe of this invention can be improved by configuring it into a rectangular loop as shown in FIG. 3. With this configuration, any static charge moving into the area around the work bench will always be near some part of the tape probe thereby improving the uniformity of the probe sensitivity.

The rectangular configuration of the tape probe is possible because the circuitry connected to the tape probe, which is described below, can sense potential changes caused by charges anywhere near any portion of a long tape probe. This feature allows the tape probe of this invention to be arranged into a number of configurations to accommodate different sizes and shapes of work areas.

In FIGS. 2 and 3, tape probe 70 is connected via a cable 20 to circuitry 10 comprising the rest of the static event detector. Preferably, cable 20 is a coaxial or triaxial cable. Circuitry 10 should be located at a convenient location as long as it is not too far from probe 70. In FIGS. 2 and 3, the circuitry is shown near the workbench, but such a position for the circuitry is not required.

The static event detector of this invention also includes means, connected to the probe, for monitoring the potential of the first layer of conductive tape (the pickup electrode), and for driving the second layer of tape with a signal proportional to that potential. In the embodiment of the invention shown in FIG. 4, this means includes the circuitry in voltage follower 100 and absolute value amplifier 300.

Figure 4:
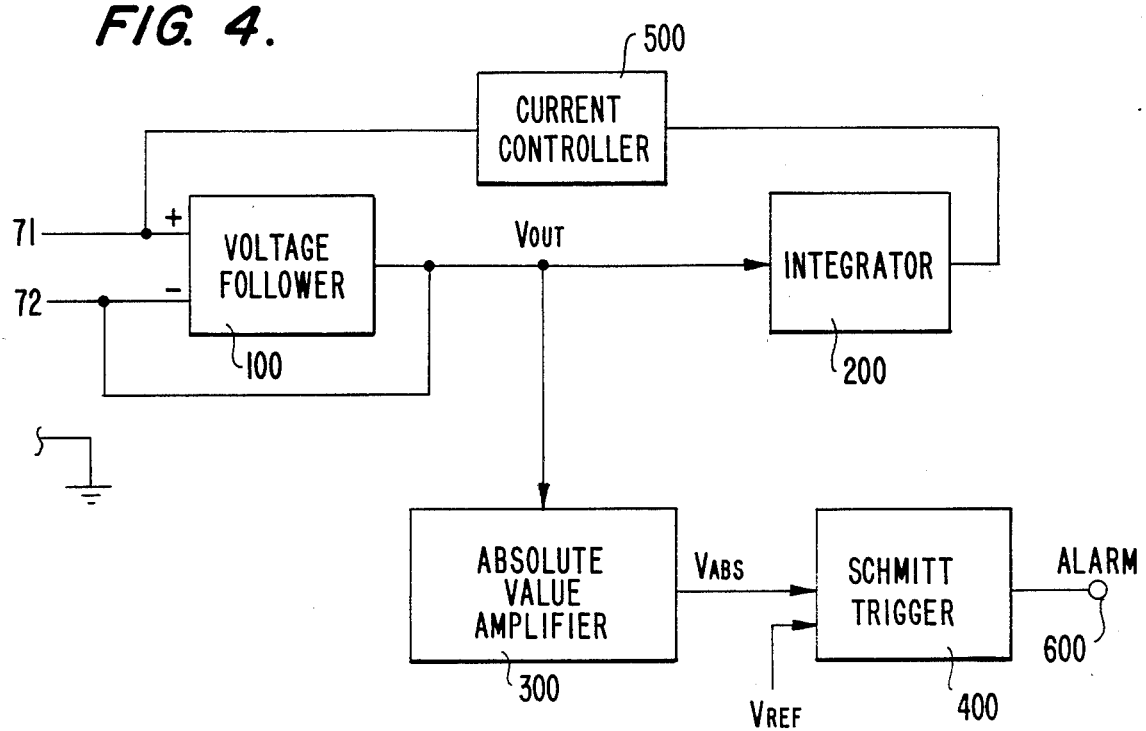
FIG. 4 shows a block diagram of the preferred circuitry for the static event detector of this invention.

As indicated above, the tape probe of this invention is typically connected to the circuitry shown in FIG. 4 via a coax or triax cable, as shown in FIGS. 2 and 3. The connecting cable is ignored in the following discussion of the circuitry in FIG. 4 since it merely transfers the signals on the probe to the circuitry.

The first layer of probe 70, pickup electrode 71, feeds the non-inverting input of voltage follower 100. The second layer of probe 70, shield electrode 72, is connected to the inverting input of voltage follower 100 which is in turn connected to the output of voltage follower 100. The output of voltage follower 100, Vout, is proportional to the potential difference between the pickup and ground.

By driving the shield electrode with the signal Vout, the effective capacitance of tape probe 70 is reduced and the probe's effective resistance is increased. For example, if the amplification factor of voltage follower 100 is 1000, Vout, also the signal on shield electrode 72, is about 0.999 times as great as the signal on pickup electrode 71. Thus by driving the shield electrode with Vout, the amplitude of the potential difference between the pickup and shield electrodes is reduced by a factor of a thousand over what the potential difference would be without such driving of the shield. This effectively reduces the capacitance of the tape probe by a thousand and increases the probe's resistance by a thousand. The details of driving shields in this manner is explained in U.S. Pat. No. 3,870,968 to Vosteen et al., which is herein incorporated by reference.

There are substantial advantages to changing the tape probe's characteristics in this manner. The preferred embodiment of the tape probe described above has a capacitance of about 1000 pf/ft. A 15-foot probe would have the capacitance of $15 \times 10^3$ pf, which is orders of magnitude larger than the input capacitance of the circuits in FIGS. 4 and 5. Such a large capacitance at the source makes the detection of the pickup probe signal almost impossible. By driving the shield electrode as described above, the capacitance of a typical 15-foot tape probe is reduced to 15 pf, significantly reducing signal attenuation.

Vout is also an input into absolute value amplifier 300 whose output, Vabs, has a single polarity and has a magnitude equal to the magnitude of Vout. The circuit details for absolute value amplifiers are well-known in the art.

The static event detector of this invention can include means for actuating an alarm signal if the induced input voltage exceeds a predetermined level. In the preferred embodiment of the circuitry shown in FIG. 4, this means includes Schmitt trigger 400 which compares Vabs with an adjustable threshold voltage, Vref. Vabs exceeds Vref when a sufficiently large charge is placed in the vicinity of the tape probe. In this situation, the output of Schmitt trigger 400 actuates alarm 600. Vref can be adjusted to reflect the size of charge whose presence needs to be detected.

It is also possible to connect a monitor to alarm 600 to determine at what time the alarm was activated. Such monitoring could help identify the sources of the harmful charge and the devices or processes affected. In addition to the elements described above, the static event detector of this invention can also include means to prevent the input of the monitoring and driving means from drifting. Preferably, this means includes an integrator circuit similar to integrator 200 and current controller 500 shown in FIG. 4.

Vout is inputted to integrator 200 to prevent the noninverting input of voltage follower 100 from drifting due to the slow buildup of residual charge on its input capacitance. Such drifting can prevent the voltage follower from responding properly to its input signals and can cause voltage follower 100 to saturate.

Current controller 500 responds to the output of integrator 200 and zeros the input voltage to the voltage follower by injecting at the input terminal a current which is equal and opposite to the voltage follower input current.

Figure 5:
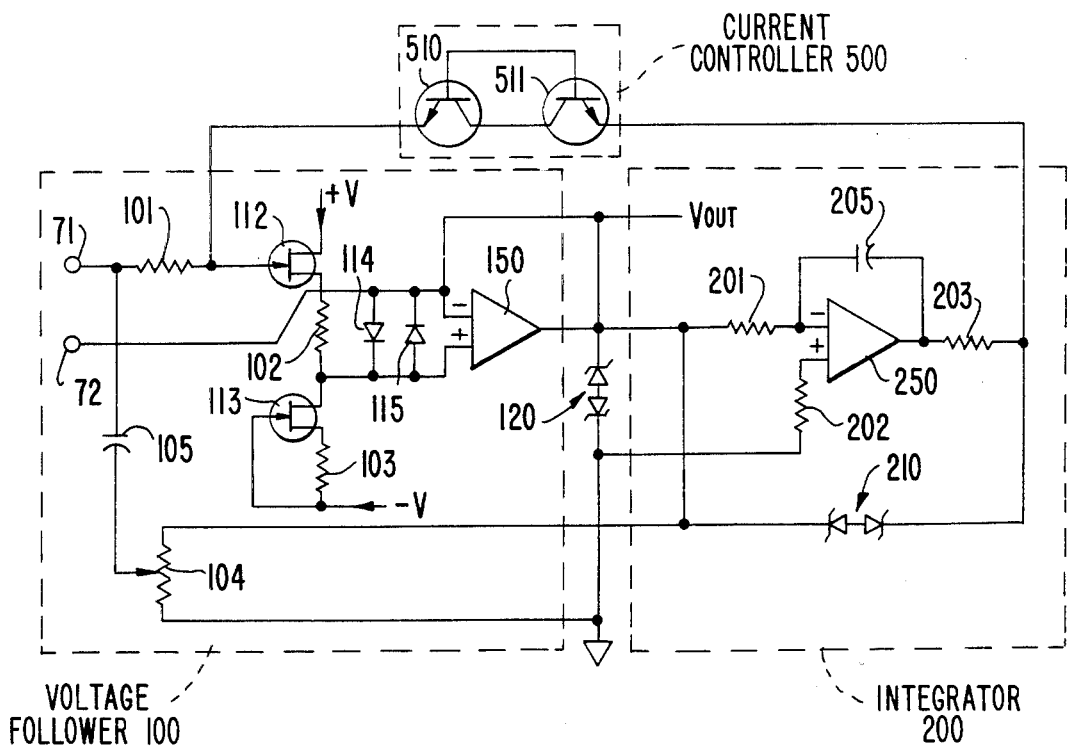
FIG. 5 shows preferred circuit details for certain of the elements of FIG. 4.

FIG. 5 shows preferred detailed circuits for voltage follower 100, integrator 200 and current controller 500.

As FIG. 5 shows, the signal from pickup electrode 71 feeds FET 112 through resistor 101. Input FET 112 has a large input impedance which keeps the input current small (about $10^{-1}$ picoamps). Input FETs 112 and 113 and resistors 102 and 103 constitute a voltage follower circuit to condition the signal from the pickup electrode 71 for input to the voltage follower 100.

The input capacitance of voltage follower 100 is essentially due to capacitor 105 in parallel with the capacitance from transistors 510 and 511. The effective capacitance of capacitor 105 can be adjusted by varying the setting of sensitivity resistor 104, which is connected between ground and Vout. When the resistance between the wiper of sensitivity resistor 104 and ground is small, capacitor 105's effective capacitance is large and dominates the capacitance of transistors 510 and 511. When the resistance between the wiper of variable resistor 104 and ground is large, the effective capacitance of capacitor 105 is reduced significantly, depending upon the amplification factor of operational amplifier 150, and the input capacitance of the circuit is due primarily to the small capacitance of transistors 510 and 511.

The shield electrode 72 of the tape probe is fed from the output of operational amplifier 150 directly. Opposite polarity diodes 114 and 115 are connected across the inputs of operational amplifier 150 to protect amplifier 150 from damage due to large transient signals on those inputs.

The output of operational amplifier 150, Vout, is connected to its inverting input to form a voltage follower circuit. The output of operational amplifier 150 is protected from large transients via inverted zener diode pair 120 connected to ground.

Vout feeds absolute value amplifier 300, shown in FIG. 4, and integrator 200. Integrator 200 includes resistors 201, 202, and 203 and capacitor 205 as well as operational amplifier 250. Resistor 201 connects Vout to the inverting input of operational amplifier 250 and resistor 202 connects amplifier 250's noninverting input to ground. Feedback capacitor 205 is connected between the output of amplifier 250 and the inverting input to configure operational amplifier 250 as an integrating circuit.

As explained above, integrator 200 eliminates the effects of drift current at the inputs of the voltage follower. The primary source of the drift current is the gate-drain current of FET 112. Since the voltage follower circuit 100 has such a large input resistance, the drift current tends to charge capacitor 105. To prevent that charge buildup, integrator 200 causes current controller 500 to inject at the gate of FET 112 a current equal and opposite to the gate drain current of FET 112.

Current controller 500 comprises transistors 510 and 511 which act together as a double-anode zener. Transistors are used rather than zener diodes because transistors typically have smaller geometries and lower leakage currents than zener diodes.

The output of integrator 200 varies the voltage on the emitter of transistor 511 to cause current controller 500 to inject a zeroing current into voltage follower 100. This zeroing current is always trying to cancel out the voltage follower input current to keep "zeroing" the voltage follower input. When a signal appears at pickup electrode 71, however, integrator 200 and current controller 500 do not respond fast enough to cancel the input voltage immediately. In this way, a sufficiently large signal at the input remains large for a long enough period of time to trigger Schmitt trigger 400.

Zener diode pair 210 protects operational amplifier 250 from damage due to large transient signals.

Typical values for the components in the circuit shown in FIG. 5 are as follows:

| Resistors (ohms) | |
|---|---|
| 101 | 1M |
| 102 | 10K |
| 103 | 10K |
| 104 | 25K |
| 201 | 100K |
| 202 | 100K |
| 203 | 100K |
| Capacitors | |
| 105 | 500 pf |
| 205 | 22 uF |
| Transistors | |
| 112 | matched PN4118A |
| 113 | matched PN4118A |
| 510 | selected 2N3565 |
| 511 | selected 2N3565 |
| Diodes | |
| 114 | 1N4148 |
| 115 | 1N4148 |
| 120 | 1N5235(2) |
| 210 | 1N5241(2) |
| Operational Amplifiers | |
| 150 | ½ LM1458N |
| 250 | ½ LM1458N |

It will be apparent to those skilled in the art that modifications and variations can be made in the static event detector of this invention. The invention, in its broader aspects, is not limited to the specific details in the demonstrative examples shown here. It is recognized, for example, that other circuits can be used to detect the signals from the tape probe and different circuits can be used for the voltage follower and integrator shown in FIG. 5. Accordingly, departure may be made from such details without departing from the spirit or scope of the general inventive concept.

What is claimed is:

1. A probe circuit for sensing the presence of charged objects, said probe circuit comprising:
   a probe for developing a signal representative of the electric field in the vicinity of said probe, said probe including
   a first layer of flat conductive tape operative as a pickup electrode,
   a second layer of flat conductive tape acting as a shield electrode and having one of its two flat sides aligned with one of the flat sides of said first layer of flat conductive tape, and
   a first strip of dielectric material aligned with and positioned between said first and second layers of conductive tape; and
   means electrically coupled to said first and second layers of tape for sensing said electric signal developed by said probe.

2. The probe circuit in claim 1 further including a third layer of flat conductive tape having one of its flat sides aligned with the other of said two flat sides of said second layer of flat conductive tape; and
   a second strip of dielectric material aligned with and positioned between said second and third layers of conductive tape.

3. The probe circuit in claim 1 or 2 wherein said layers of flat conductive tape include copper and wherein said strips of dielectric material include polyester film.

4. The probe circuit in claim 2 wherein said first and second layers of conductive tape are narrower than said third layer of conductive tape.

5. An apparatus for detecting the movement of charged objects, said apparatus comprising:
   a sensing probe including
   a first layer of flat conductive tape acting as a pickup electrode,
   a second layer of flat conductive tape acting as a shield electrode and having one of its two flat sides aligned with one of the flat sides of said first conductive tape,
   a first strip of dielectric material aligned with and positioned between first and second layers of conductive tape; and
   means connected to said probe for monitoring the potential on said first layer of conductive tape and for driving said second layer of tape with an electric signal proportional to said potential on said first tape layer.

6. The apparatus in claim 5 wherein said probe further includes:
   a third layer of flat conductive tape acting as a ground electrode and having one of its flat sides aligned with the other of said two flat sides of said second layer of flat conductive tape; and
   a second layer of dielectric material aligned with and positioned between said second and third layers of conductive tape.

7. The apparatus in claim 6 wherein each of said layers of flat conductive tape includes copper and wherein each of said dielectric strips includes polyester film.

8. The apparatus in claim 7 wherein said first and second layers of conductive tape are narrower than said third layer of conductive tape.

9. The apparatus in any one of claims 5, 7 and 8 further comprising means, connected to said monitoring and driving means, for actuating an alarm signal if said potential difference between said first layer of conductive tape and ground exceeds a predetermined level.

10. The apparatus in claim 9 wherein said monitoring and driving means includes:
    a voltage follower circuit having a first input connected to said first layer of conductive tape, and an output connected to a second input of said voltage follower circuit and to said second layer of conductive tape to drive said second layer;
    an absolute value amplifier whose input is connected to said output of said voltage follower; and
    wherein said alarm signal actuating means includes a Schmitt trigger circuit connected to said output of said absolute value circuit.

11. The apparatus in claim 10 further including means connected to said monitoring and driving means for preventing the input of said monitoring and driving means from drifting.

12. The apparatus in claim 11 wherein said drift prevention means includes an integrator circuit.

13. The apparatus of claim 12 wherein said drift prevention means also includes a current controller circuit connected between said integrator circuit and said monitoring and driving means.

14. The apparatus in claim 5 or 6 wherein said sensing probe is configured in a closed loop.

15. An apparatus for detecting the movement of charged objects comprising:
    a sensing probe including a pickup electrode;
    means connected to said sensing probe for monitoring the potential on said pickup electrode; and
    means connected between said pickup electrode and said monitoring means for driving the potential on said pickup electrode to a predetermined level.

16. The apparatus in claim 15 wherein said potential driving means includes an integrator coupled to the output of said monitoring means.

17. The apparatus in claim 15 wherein said potential driving means includes a current controller coupled to said pickup electrode.

18. The apparatus in claim 15, wherein said probe also includes a shield electrode and wherein said monitoring means includes means for maintaining the potential on said shield electrode approximately equal to the potential on said pickup electrode.

* * * * *